(12) United States Patent
Kato et al.

(10) Patent No.: US 8,872,121 B2
(45) Date of Patent: Oct. 28, 2014

(54) RADIATION IMAGING APPARATUS

(75) Inventors: Katsushi Kato, Kawasaki (JP); Masaaki Kobayashi, Shimotsuke (JP); Satoru Omura, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 151 days.

(21) Appl. No.: 13/390,646

(22) PCT Filed: Aug. 25, 2010

(86) PCT No.: PCT/JP2010/005239
§ 371 (c)(1),
(2), (4) Date: Feb. 15, 2012

(87) PCT Pub. No.: WO2011/024452
PCT Pub. Date: Mar. 3, 2011

(65) Prior Publication Data
US 2012/0138798 A1     Jun. 7, 2012

(30) Foreign Application Priority Data

Aug. 31, 2009    (JP) ................. 2009-200244

(51) Int. Cl.
*G01T 1/24*     (2006.01)
*H01L 27/146*   (2006.01)

(52) U.S. Cl.
CPC .......... *G01T 1/244* (2013.01); *H01L 27/14618* (2013.01)
USPC .................................................. 250/370.15

(58) Field of Classification Search
CPC ........................................................ G01T 1/244
USPC .................................................. 250/370.15
See application file for complete search history.

(56) References Cited

U.S. PATENT DOCUMENTS

2005/0094371 A1* 5/2005 Lai ................................ 361/687
2009/0080605 A1* 3/2009 Miyako et al. ................. 378/37

FOREIGN PATENT DOCUMENTS

| CN | 1540364 A | 10/2004 |
|----|-----------|---------|
| CN | 1994029 A | 7/2007 |
| EP | 1471368 A | 10/2004 |
| JP | 10177224 A | 6/1998 |
| JP | 2004327825 A | 11/2004 |
| JP | 2005181922 A | 7/2005 |
| JP | 2005283262 A | 10/2005 |
| JP | 2006242702 A | 9/2006 |
| JP | 2007256176 A | 10/2007 |
| JP | 2008219734 A | 9/2008 |
| WO | 02071098 A | 9/2002 |

* cited by examiner

*Primary Examiner* — Constantine Hannaher
(74) *Attorney, Agent, or Firm* — Canon USA, Inc. IP Division

(57) ABSTRACT

A radiation imaging apparatus includes: a first cooling fan configured to cool a first heat generation portion of a radiation detection unit housed in the radiation imaging apparatus, by blowing a cooling medium to the first heat generation portion; a second cooling fan configured to cool a second heat generation portion of the radiation detection unit housed in the radiation imaging apparatus, which is larger in amount of generated heat than the first heat generation portion, by blowing the cooling medium to the second heat generation portion; and a discharge port formed in a position nearer to the second heat generation portion than to the first heat generation portion and configured to discharge the cooling medium which received heat from the first heat generation portion and the cooling medium which received heat from the second heat generation portion.

8 Claims, 9 Drawing Sheets

RADIATION IMAGING APPARATUS

TECHNICAL FIELD

The present invention relates to a radiation imaging apparatus that includes a radiation detection unit configured to acquire a radiation image by detecting radiation.

BACKGROUND ART

A radiation imaging apparatus system includes a radiation generation apparatus and a radiation imaging apparatus including a radiation detection unit, which are oppositely arranged to sandwich an object, and irradiates the object with radiation to acquire image information based on a signal output from the radiation detection unit. Mainly, the radiation imaging apparatus system is widely used in the fields of medical diagnosis and industrial nondestructive inspection.

As a radiation imaging apparatus recently becoming widespread, there is a radiation flat-panel detector. The radiation flat-panel detector includes a combination of a photoelectric conversion panel arraying photoelectric conversion elements for converting visible light into electric charge and switching elements (TFT) in a matrix and a phosphor for converting radiation into visible light. Radiation incident on the radiation flat-panel detector is converted into visible light by the phosphor, and the visible light is converted into electric charge by the photoelectric conversion elements. A built-in electronic circuit performs various processes based on the acquired electric charge to acquire digital image information.

The recent widespread use of the radiation flat-panel detector has been accompanied by more stringent requirements for image quality improvement in the radiation imaging apparatus, miniaturization of the apparatus, stability of a captured image, and durability of the apparatus.

To meet such requirements, a heat generation problem concerning malfunctions or lifetimes of electronic components cannot be avoided, necessitating an efficient heat radiation unit. Efficiently radiating heat enables normal operations of electronic components, guaranteeing of durability, and prevention of characteristic deterioration of a radiation detection unit caused by a temperature increase.

As a conventional technique for heat radiation, Japanese Patent Application Laid-Open No. 10-177224 discusses a method for opening and closing a vent shutter for a heat radiation fan according to a driving condition of a radiation imaging apparatus.

Japanese Patent Application Laid-Open No. 2005-181922 discusses a method for detachably mounting a cooling unit, including a heat radiation fan, on a casing exterior of a radiation imaging apparatus.

The radiation imaging apparatus generally includes electronic components, such as a signal processing unit and a power source, which have heat higher than other electronic components during capturing of a radiation moving image. In the radiation imaging apparatus, a difference in amount of generated heat between various electronic components causes a temperature difference. In many cases, the temperature difference in the radiation imaging apparatus adversely affects an imaging process. When a temperature difference occurs between the photoelectric conversion elements in the radiation imaging apparatus, a dark current varies from one photoelectric conversion to the other, causing a captured radiation image to be non-uniform. Particularly, a photoelectric conversion element used in the radiation imaging apparatus, which is mainly used to photograph a human body, is larger than an image sensor included in general video cameras. A temperature distribution in the radiation imaging apparatus greatly affects the quality of a captured radiation image. The captured radiation image is used for a medical practice, and hence the accuracy required of image quality is high. Thus, considering a temperature difference in the radiation imaging apparatus is important for designing the radiation imaging apparatus.

A flow of a cooling medium (air) in the radiation imaging apparatus greatly affects the temperature distribution in the radiation imaging apparatus. For example, when an electronic component having high heat is cooled by the heat radiation fan without taking into consideration the flow of air in the radiation imaging apparatus, the heated air flows to the other electronic components, thus heating those components. Consequently, the temperature distribution in the radiation imaging apparatus becomes non-uniform, adversely affecting the quality of a captured radiation image. If a discharge port for discharging the heated air from the radiation imaging apparatus is formed in an inappropriate position, an unexpected flow of air occurs in the radiation imaging apparatus, probably causing the heated air to heat the electronic components in the radiation imaging apparatus. Particularly, if a plurality of discharge ports is provided in the radiation imaging apparatus, external air frequently flows in and out, thus disabling prediction of a flow of air in the radiation imaging apparatus.

The technique discussed in Japanese Patent Application Laid-Open No. 10-177224 enables heat radiation suited to a driving condition. The technique discussed in Japanese Patent Application Laid-Open No. 2005-181922 enables heat radiation of the radiation imaging apparatus suited to a photographing condition by mounting the cooling unit according to the photographing condition. Both techniques are directed to higher efficiency of heat radiation. However, neither of the techniques gives any consideration to the flow of a cooling medium in the radiation imaging apparatus during capturing of a radiation moving image and, hence, both the techniques are unable to solve the problems caused by the temperature difference.

SUMMARY OF INVENTION

The present invention is directed to reducing a non-uniform temperature distribution in a radiation imaging apparatus by appropriately discharging a cooling medium from the radiation imaging apparatus during capturing of a radiation moving image.

According to an aspect of the present invention, there is provided a radiation imaging apparatus capable of housing a radiation detection unit configured to detect radiation. The radiation imaging apparatus includes first cooling means configured to cool a first heat generation portion of the radiation detection unit housed in the radiation imaging apparatus by a cooling medium in the radiation imaging apparatus, second cooling means configured to cool a second heat generation portion of the radiation detection unit housed in the radiation imaging unit, which is larger in amount of generated heat than the first heat generation portion, by the cooling medium, and a discharge port formed in a position nearer to the second heat generation portion than to the first heat generation portion and configured to discharge the cooling medium.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

DESCRIPTION OF EMBODIMENTS

Various exemplary embodiments, features, and aspects of the invention will be described in detail below with reference to the drawings.

A radiation imaging apparatus of a radiation imaging apparatus system according to a first exemplary embodiment of the present invention will be described. The radiation imaging apparatus synchronizes with a radiation generation apparatus in the radiation imaging apparatus system, and acquires a captured radiation image by detecting radiation transmitted through an object. Hereinafter, a configuration of the radiation imaging apparatus is described.

Figure 1:
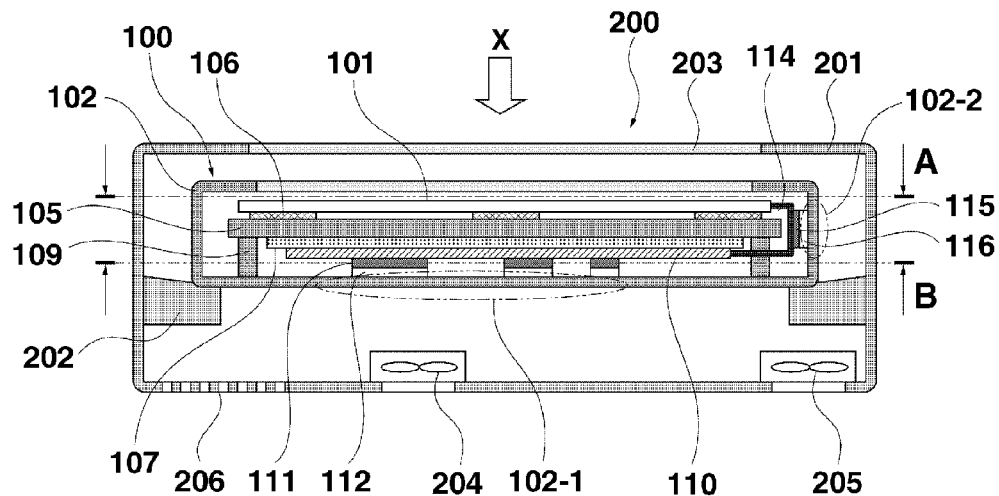
FIG. 1 is a sectional view of a radiation imaging apparatus taken along a plane perpendicular to a radiation-image receiving surface.
Figure 2:
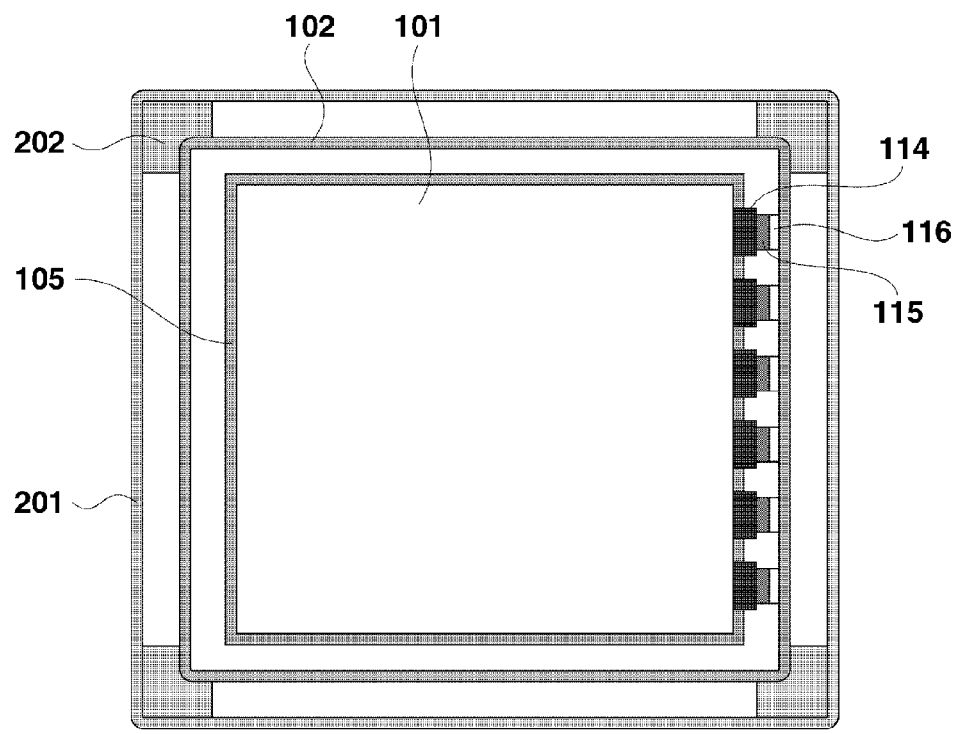
FIG. 2 is a sectional view taken along line A-A illustrated in FIG. 1.
Figure 3:
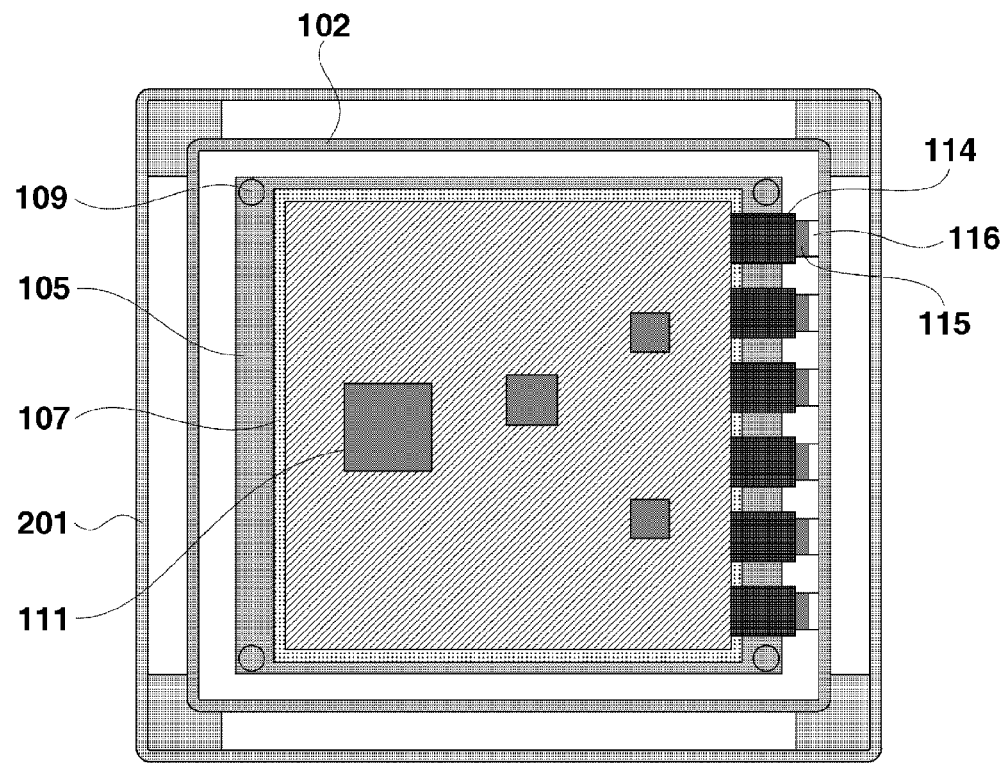
FIG. 3 is a sectional view taken along line B-B illustrated in FIG. 1.
Figure 4:
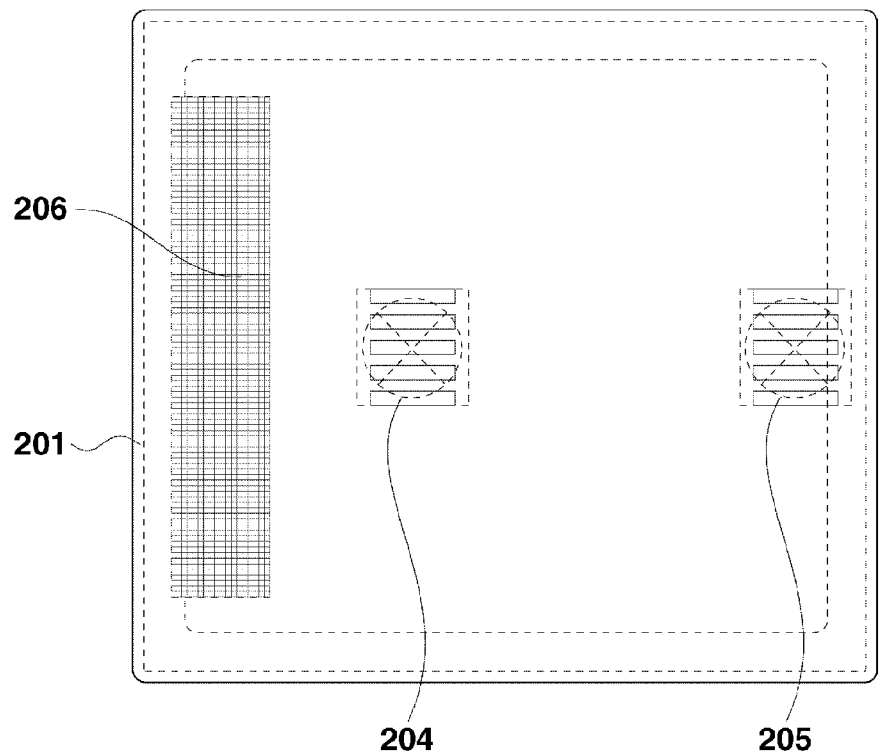
FIG. 4 is a rear view illustrating the radiation imaging apparatus.

FIG. 1 is a sectional view of the radiation imaging apparatus along a plane perpendicular to a radiation-image receiving surface. FIG. 2 is a sectional view take along line A-A illustrated in FIG. 1. FIG. 3 is a sectional view taken along line B-B illustrated in FIG. 1. FIG. 4 is a rear view illustrating the radiation imaging apparatus.

The radiation imaging apparatus according to the first exemplary embodiment includes a cassette-type imaging unit 100 and an imaging-unit housing portion 200.

The cassette-type imaging unit 100 includes a radiation detection unit configured to convert radiation into an electric signal, various electric components configured to drive the radiation detection unit to take out a signal, and a machine component configured to hold the radiation detection unit and the electric components. The cassette-type imaging unit 100 is detached from the imaging-unit housing portion 200 described below to be able to execute radiation imaging singly, and accordingly can perform various photographing operations as an electronic cassette.

The radiation detection unit 101, which is configured to convert radiation into an electric signal, is disposed in a cassette casing 102, which is an exterior of the cassette-type imaging unit 100. The radiation detection unit 101 is fixed to a highly rigid inner frame member 105 via a supporting member 106.

The inner frame member 105 is connected to an inner wall of the cassette casing 102 via braces 109 provided in a plurality of places. An electric substrate 110 is attached to a rear surface side of the inner frame member 105. A functional member 107 is disposed between the inner frame member 105 and the electric substrate 110 to provide electric insulation, radiation blocking, electromagnetic wave blocking, and heat insulation.

To configure the cassette-type imaging unit 100 thin and compact, almost no portion other than a detection area of the radiation detection unit 101, more specifically, almost no space of a frame, can be secured. Hence, the electric substrate 110 is disposed on the rear surface side of the inner frame member 105.

An end of a flexible printed circuit board 114 (tape carrier package (TCP)) is connected to one side of the radiation detection unit 101 having a rectangular outer shape. The other end of the flexible printed circuit board 114 is connected to the electric substrate 110.

As illustrated in FIG. 2, the flexible printed circuit board 114 is divided into a plurality of boards according to block division during electric processing. In FIG. 2, a plurality of flexible printed circuit boards similar in shape is arrayed in parallel. However, the flexible printed circuit board 114 can include a signal wide member.

The flexible printed circuit board 114 functions as an analog-digital (AD) conversion unit (signal converting unit) to execute AD conversion for a radiation detection signal detected by the radiation detection unit 101 or a signal amplifying unit.

The imaging-unit housing portion 200 can house the cassette-type imaging unit 100. A surface of the radiation imaging apparatus facing the radiation generation apparatus is an image receiving surface (upper surface of the imaging-unit housing portion 200), and a surface of the opposite side is a rear surface. The radiation transmitted through an object enters the image receiving surface from an arrow direction X.

Some holders are provided in a housing-portion casing 201 to support the housed cassette-type imaging unit 100. A position of the cassette-type imaging unit 100 can be fixed by an urging unit. When the cassette-type imaging unit 100 is housed, a part of the imaging-unit housing portion 200 is opened/closed to house the cassette-type imaging unit 100. A surface plate 203 on a side of the imaging-unit housing portion 200 facing the radiation generation apparatus is a plate member made of a material that can transmit radiation. The housing-portion casing 201 and the surface plate 203 constitute a sealed space.

The imaging-unit housing portion 200 is used as a function-expansion addition unit of the cassette-type imaging unit 100. However, the imaging-unit housing portion 200 can be fixed to a support stand such as a stand, a table or an arm by a support mechanism (not illustrated) to function as an imaging unit installed on a shooting stand.

Figure 5:
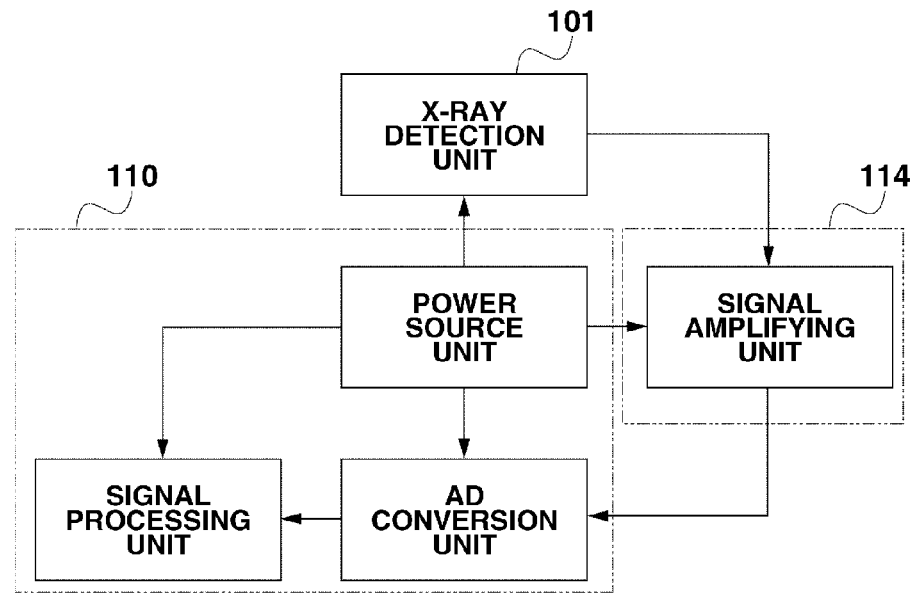
FIG. 5 illustrates an electric configuration of a cassette-type imaging unit according to a first exemplary embodiment of the present invention.

FIG. 5 illustrates an electric configuration of the cassette-type imaging unit 100 according to the first exemplary embodiment.

An analog detection signal output from the radiation detection unit 101 is amplified by the signal amplifying unit including an amplifier circuit, and converted into a digital signal by the AD conversion unit. The digital signal is subjected to processing to be output as image information by the signal processing unit. The radiation detection unit 101, the signal amplifying unit, the AD conversion unit, and the signal processing unit all need power to be driven. Thus, these components are connected to a power source unit to receive power.

As illustrated in FIG. 5, the signal amplifying unit is disposed on the flexible printed circuit board 114 near the radiation detection unit 101. Disposing the signal amplifying unit in a position near the radiation detection unit 101 enables prevention of information deterioration caused by noise before signal amplification. In FIG. 5, the AD conversion unit is disposed on the electric substrate 110. However, the AD conversion unit can be mounted on the flexible printed circuit board 114.

The AD conversion unit, the signal processing unit, and the power source unit are configured as parts of the electric substrate 110. More specifically, these components are configured as a plurality of electric substrates divided based on functions.

Hereinafter, a heat generation member in the radiation imaging apparatus is described.

As described above, the flexible printed circuit board 114 includes an electric element 115 constituting the signal amplifying unit or the AD conversion unit. A resistor is mounted in the electric element 115. When a current flows through the resistor, a most part of electric energy is converted into thermal energy, and hence a total amount of generated heat is large. Thus, in the first exemplary embodiment, the electric element 115 is a heat generation member, which is a heat radiation target.

A highly densely mounted integrated circuit (IC) used for the AD conversion unit or the signal processing unit, or an electric element such as a capacitor or a regulator used for a power source unit of a high output is an electric element 111 in which an amount of generated heat is very large. The electric element 111 is mounted on the electric substrate 110. When the radiation imaging apparatus needs high-speed processing, an amount of generated heat in the electric element 111 exceeds that of the electric element 115. Thus, in the first exemplary embodiment, the electric element 111 is a heat generation member, which is also a heat radiation target.

In the radiation detection unit 101, the amount of a dark current in the photoelectric conversion element constituting each pixel varies from one pixel to another. A transfer amount indicating an electric-charge transfer capability of a switching element varies from one pixel to another. These variations are corrected by using a standard image acquired beforehand.

The dark current and the transfer amount are temperature-dependent. The temperature dependency varies from one pixel to another. When a temperature increases during capturing with respect to a temperature at the time of acquiring the standard image for correction, a signal output value from each pixel is different from information input as radiation intensity.

A position distribution of the electric elements 111 and 115 large in amount of generated heat affects a temperature distribution in the detection area of the radiation detection unit 101.

A temperature increase over time changes depending on the distribution of the electric elements 111 and 115. Hence, when heat is not appropriately radiated, image information that unstably fluctuates according to space and time is output. A part having a density different from an actual density is generated in the output image, causing a difficulty of finding any abnormalities in the object. A change in density over time results in an image difficult to be observed. This situation should be prevented. Thus, heat must preferentially be radiated from the electric elements 111 and 115.

Referring to FIG. 1, a configuration for radiating heat from the electric elements 111 and 115 according to the first exemplary embodiment will be described below.

Heat conductive members 112 and 116 radiate heat from the electric elements 111 and 115, which are high heat generation portions. Heat from the electric elements 111 and 115, which are high heat generation portions, is conducted through the heat conductive members 112 and 116 to the rear surface and the side surface of the cassette casing 102.

In FIG. 1, to conduct the heat from the electric element 115 to the side surface that is a closest exterior as a heat transmission destination, the heat conductive member 116 is disposed therebetween. However, the heat can be conducted to the other portions.

The cassette casing 102 is made of a light and highly heat conductive material, such as an aluminum or magnesium alloy. The heat from the electric elements 111 and 115 is, in the case of the single cassette-type imaging unit 100, finally radiated in the form of natural convection or radiation from the exterior surface of the cassette casing 102. The cassette-type imaging unit 100 includes only minimum components necessary for capturing without any heat radiation unit such as forcible cooling for circulating fluids therein. Thus, the thin and light cassette-type imaging unit 100 can be installed at low costs.

However, when the cassette-type imaging unit 100 is used in a usual radiation imaging room, a shooting frequency is high overall, increasing an average amount of generated heat. In the case of the single cassette-type imaging unit 100 having no special heat radiation unit, an amount of generated heat exceeds an amount of radiated heat, which may result in a larger temperature increase of each unit. Such a use condition can be dealt with by loading the cassette-type imaging unit 100 in the imaging-unit housing portion 200.

A first cooling fan 204 and a second cooling fan 205, which are heat radiation units, radiate heat from the imaging-unit housing portion 200.

The first cooling fan 104 and the second cooling fan 205 feed a cooling medium into the imaging-unit housing portion 200, and radiate heat by blowing the cooling medium to the exterior surface of the cassette casing 102. Air is mainly used for the cooling medium. However, cooling effects can be provided by other media such as gas and liquid.

The housing-portion casing 201 includes a discharge port 206 formed to discharge the cooling medium, which has received heat to become high in temperature, out of the imaging-unit housing portion 200. The object is disposed on the radiation-image receiving surface side, and hence blowing of the cooling medium high in temperature toward the object should be avoided. Thus, the discharge port 206 is formed mainly on the rear surface or the side surface of the imaging-unit housing portion 200.

The imaging-unit housing portion 200 is configured as a box body having almost no opening other than openings for the first cooling fan 204 and the second cooling fan 205 and the discharge port. This configuration can prevent influence of electromagnetic wave noise and incursion of dust, and can efficiently circulate the cooling medium.

With the above-described configuration, the heat from the electric elements in the cassette-type imaging unit 100 is conducted through the above-mentioned path to the outside of the cassette casing 102. The cassette casing 102 uses the highly heat conductive material, and the entire apparatus including the cassette casing 102 is configured thin, and hence a temperature near the electric element high in amount of generated heat becomes locally high. Targeting parts of the side surface and the rear surface of the cassette casing 102 located near the electric element as heat exchange portions for cooling enables efficient heat radiation.

A part of the cassette casing 102, which has received the heat from the electric element 111 via the heat conductive member 112, is set as a first heat exchange portion (first heat generation portion) 102-1. A part of the cassette casing 102, which has received the heat from the electric element 106 via the heat conductive member 116, is set as a second heat exchange portion (second heat generation portion) 102-2.

In FIG. 1, the heat exchange portions 102-1 and 102-2 are not different from other exterior surfaces of the cassette casing 102. However, some processing can be performed to improve heat exchange efficiency. For example, painting or various surface treatments can be added to improve thermal emissivity, or many fins or fine uneven patterns can be formed to increase a surface area.

Holders 202 are disposed to support only portions near four corners of the rear surface of the cassette casing 102, avoiding a center vicinity of the rear surface of the cassette casing that is a heat exchange portion. Thus, a sufficient amount of a cooling medium is supplied to the heat exchange portion. When there is a heat exchange portion on the side surface of the cassette casing 102, the holder 202 can be formed into a shape not covering the heat exchange portion.

A power source unit or a signal processing unit serves as the electric element 111, which conducts heat to the first heat exchange portion 102-1. These components are parts of the electric substrate 110, and hence concentrate on the rear surface of the cassette-type imaging unit 100. Thus, an amount of heat conducted to the first heat exchange portion 102-1 is particularly large. Disposing the first cooling fan near the first heat exchange portion 102-1 increases a flow rate of the cooling medium at the heat exchange portion, thereby improving heat exchange efficiency. A fan more powerful than other fans can be disposed, or a plurality of fans can be disposed.

The second cooling fan 205 is disposed near the second heat exchange portion 102-2.

The cooling medium is introduced into the imaging-unit housing portion 200 by the cooling fan, and receives heat from the heat exchange portions 102-1 and 102-2 to be discharged out of the discharge port 206. One of the other cooling methods is the use of a fan motor provided in the discharge port as a fan to discharge the cooling medium. In the first exemplary embodiment, however, priority is placed on efficient heat radiation realized by applying a fast flow limited in loss of a flow rate to the heat exchange portion immediately after the cooling fan.

The cooling medium blown to the first heat exchange portion 102-1 receives much heat from the first heat exchange portion 102-1. The cooling medium high in temperature should be prevented from flowing to the other portions of the cassette-type imaging unit 100 to conduct heat to the other members. Thus, the discharge port 206 for discharging the cooling medium high in temperature is formed in a position nearer to the first heat exchange portion 102-1 than to the second heat exchange portion 102-2. Forming the discharge port 206 in the position nearer to the first heat exchange portion 102-1 enables discharging of the cooling medium high in temperature to the outside, thereby preventing heating of the other members in the imaging-unit housing portion 200.

Internal heat is conducted to the other exterior surfaces of the cassette casing 102 in addition to the heat exchange portions 102-1 and 102-2. Thus, in the case of housing the cassette-type imaging unit 100 in the imaging-unit housing portion 200 to perform shooting, when a certain part of the cooling medium around the exterior surface of the cassette casing 102 stagnates, a temperature of the stagnant part increases. Particularly, when there is a distribution of high and low temperatures within the detection area surface of the radiation detection unit 101, as described above, the quality of a captured radiation image is adversely affected. According to the configuration of the first exemplary embodiment, stagnation of the cooling medium can be prevented by generating a flow of the cooling medium near the radiation detection unit 101 without adding any fan motor for preventing stagnation of the cooling medium.

In a radiation-image receiving unit of the first exemplary embodiment, stagnation of the cooling medium is prevented by supplying the cooling medium from the second cooling fan 205 around the cassette casing 102. Hereinafter, a flow of the cooling medium in the imaging-unit housing portion 200 is described.

Figure 6:
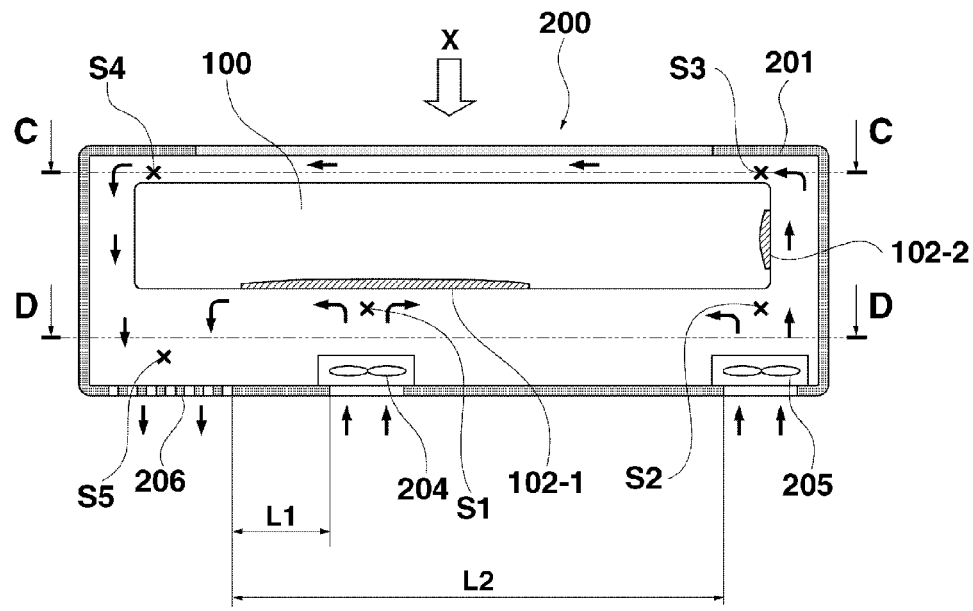
FIG. 6 is a sectional view of the radiation imaging apparatus taken along a plane perpendicular to a radiation-image receiving surface.
Figure 7:
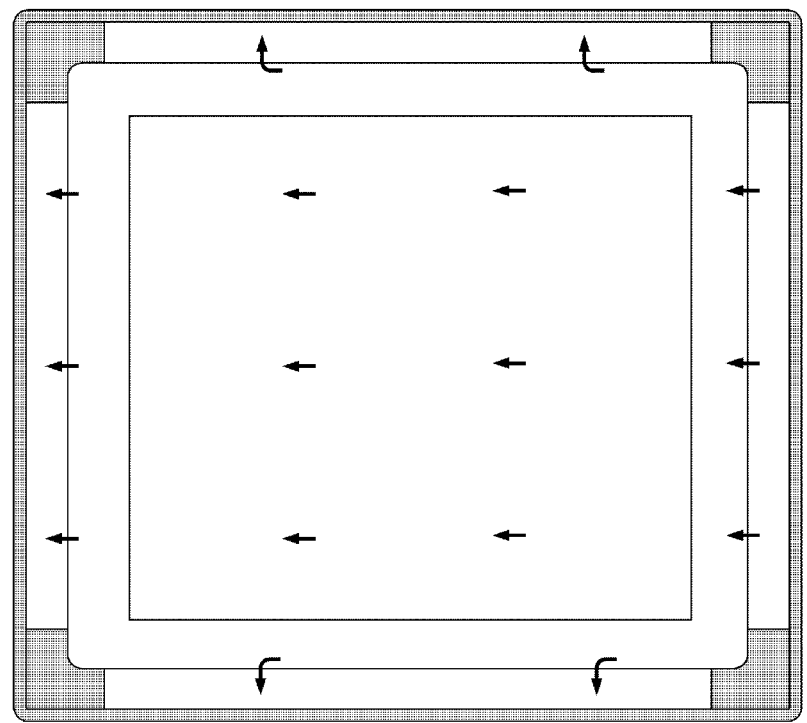
FIG. 7 is a sectional view taken along line C-C illustrated in FIG. 6.
Figure 8:
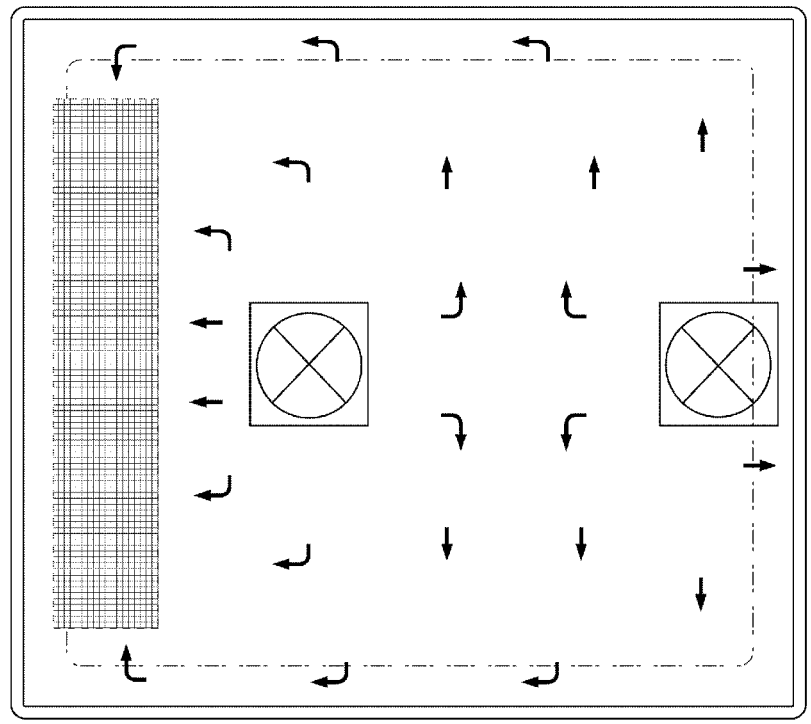
FIG. 8 is a sectional view taken along a line D-D illustrated in FIG. 6.

FIGS. 6 to 8 schematically illustrate a flow of the cooling medium in the imaging-unit housing portion 200. FIG. 6 is a sectional view of the radiation imaging apparatus taken along a plane perpendicular to the radiation-image receiving surface. FIG. 7 is a sectional view taken along line C-C illustrated in FIG. 6. FIG. 8 is a sectional view taken along line D-D illustrated in FIG. 6.

FIG. 6 illustrates respective positions S1, S2, S3, S4 to S5, where pressures PS1 to PS5 (not shown) are respectively applied, in the internal space of the imaging-unit housing portion 200. Pressure addition by the cooling fan or a pressure reduction by cooling medium discharging establishes the following relationships of the pressures PS1 to PS5 on the respective positions S1 to S5:

PS1>PS5
PS2>PS3>PS4>PS5

Magnitudes of the pressures PS1 and PS2 on positions S1 and S2 depend on selection of fan performance, a distance from a spraying surface, or a blowing surface shape. Compared with the pressure PS5, however, the pressures PS1 and PS2 are sufficiently large with almost no difference therebetween. Thus, the cooling medium flows from a place of a high pressure to a place of a low pressure, and hence flows of a cooling medium indicated by thick arrows in FIG. 6 are generated.

The cooling medium blown from the first cooling fan 204 in the position S1 receives much heat from the first heat exchange portion 102-1, and flows to the position S5 lowest in pressure and near in distance to be discharged through the discharge port 206 to the outside. A section where the flow of the cooling medium comes into contact with the exterior surface of the cassette casing 102 during this period is a short section according to a distance between the first cooling fan 204 and the discharge port 206, limiting conduction of heat back to the exterior surface of the cassette casing 102 by the cooling medium high in temperature to a minimum.

The cooling medium blown from the second cooling fan in the position S2 receives, without flowing in a direction near the position S1 high in pressure, heat from the second heat exchange portion 102-2, and sequentially flows through the positions S3 and S4, and through the position S5 to be discharged out of the discharge port 206. The cooling medium flows along much of the exterior surface of the cassette casing 102 by a fixed distance between the second cooling fan 205 and the discharge port 206. The cooling medium receives the heat from the second heat exchange portion 102-2. However, an amount of heat received is smaller than that of the cooling medium received from the first heat exchange portion 102-1. Hence, there is only limited adverse influence of conduction of heat back to the exterior surface of the cassette casing 102 by the cooling medium.

A relationship of L2>L1 is established when there is a distance L1 between the first cooling fan 204 and the discharge port 206 and there is a distance L2 between the second cooling fan 205 and the discharge port 206. The distance between the cooling fan and the discharge port means a minimum distance valid as a flow path, and is defined as a shortest flow path length.

The shortest flow path length between the first cooling fan 204 and the discharge port 206 is shorter than that between the second cooling fan 205 and the discharge port 206, and hence no cooling effect by the second cooling fan 205 is lost. Thus, the heat conducted from the first heat exchange portion 102-1 to the cooling medium can be quickly discharged to the outside while suppressing adverse effects of conduction of heat back to the other portions.

The second cooling fan 204 generates a flow of the cooling medium along the other exterior surface of the cassette casing in addition to the second heat exchange portion 102-2, further enhancing cooling effects.

For example, when the discharge port 206 is located between the first cooling fan 204 and the second cooling fan 205, a flow of the cooling fan from the second cooling fan 205 is guided to the discharge port 206 without being affected by pressure addition by the first cooling fan 204. Then, a flow of the cooling medium directed to other than the second heat exchange portion 102-2 is difficult to be generated, disabling generation of a flow of the cooling medium along the exterior surface of the cassette casing. Consequently, the cooling effects are reduced.

According to the first exemplary embodiment, the discharge port is disposed to prevent the above-mentioned problem. More specifically, the discharge port 206 is disposed in the position other than between the first cooling fan 204 and the second cooling fan 205. Thus, the flow of the cooling medium from the second cooling fan 205 is affected by the pressure addition by the first cooling fan 204, enabling generation of a flow of the cooling medium directed to other than the second heat exchange portion 102-2. The flow of the cooling medium from the first cooling fan 204 is affected by the pressure addition by the second cooling fan 205, providing effects of strengthening the flow of the cooling medium passed through the first heat exchange portion 102-1 to be high in temperature to the discharge port. As a result, the cassette casing is efficiently cooled without increasing the number of fan motors, and the manufacturing cost and power consumption can be prevented from increasing.

According to the first exemplary embodiment, the first heat exchange portion 102-1 is disposed so that heat can be conducted from the electric substrate 110 including the signal processing unit and the power source unit very high in amount of generated heat. The second heat exchange portion 102-2 is disposed so that heat can be conducted from the flexible printed circuit board 114 including the signal amplifying unit equally large in amount of generated heat. Thus, the cassette-type imaging unit can be more effectively cooled.

Particularly, when an outer shape of the radiation detection unit 101 is rectangular, the flexible printed circuit board 114 is connected to at least one side of the outer edge of the radiation detection unit 101, and disposed near the outer edge. The electric substrate 110 is disposed near the center of the rear surface with respect to the radiation-image receiving surface of the radiation detection unit 101. Thus, particularly appropriate cooling effects can be provided.

Irrespective of roles of the electric elements and limitation of the circuit substrate configuration, similar effects can be provided by connecting various electric elements to the first and second heat exchange portions.

Figure 9:
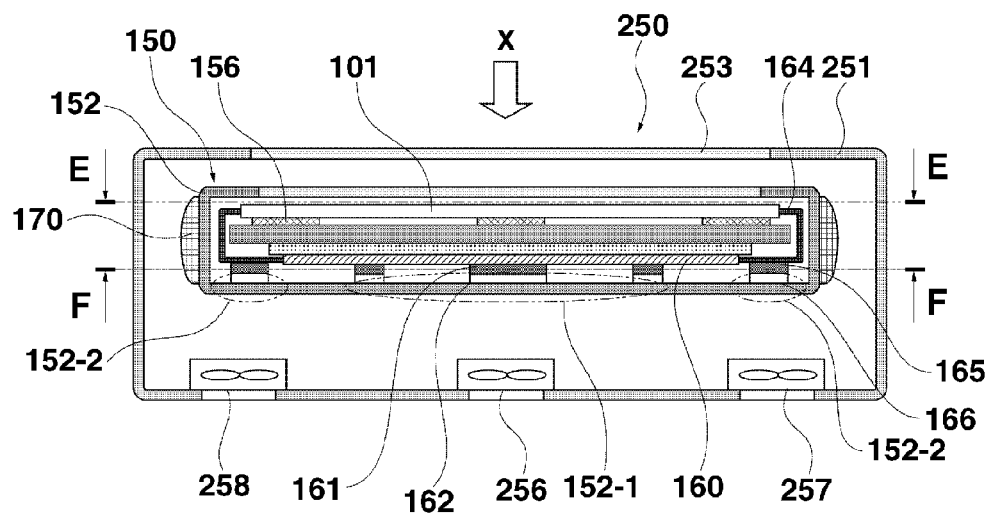
FIG. 9 is a sectional view of a radiation imaging apparatus taken along a plane perpendicular to a radiation-image receiving surface according to a second exemplary embodiment of the present invention.
Figure 10:
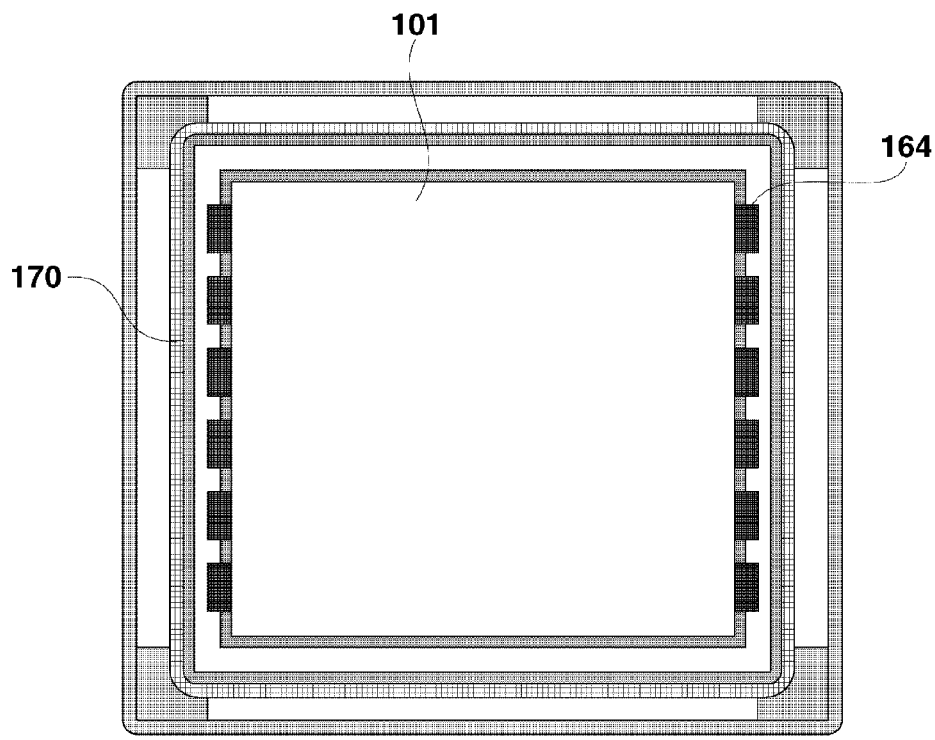
FIG. 10 is a sectional view taken along line E-E illustrated in FIG. 9.
Figure 11:
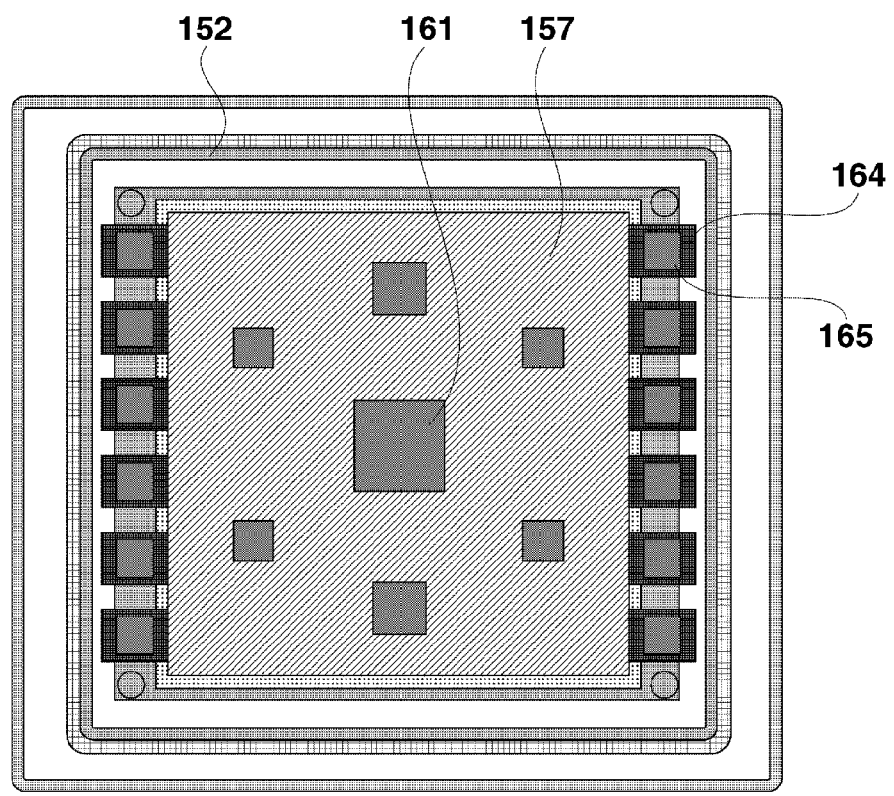
FIG. 11 is a sectional view taken along line F-F illustrated in FIG. 9.
Figure 12:
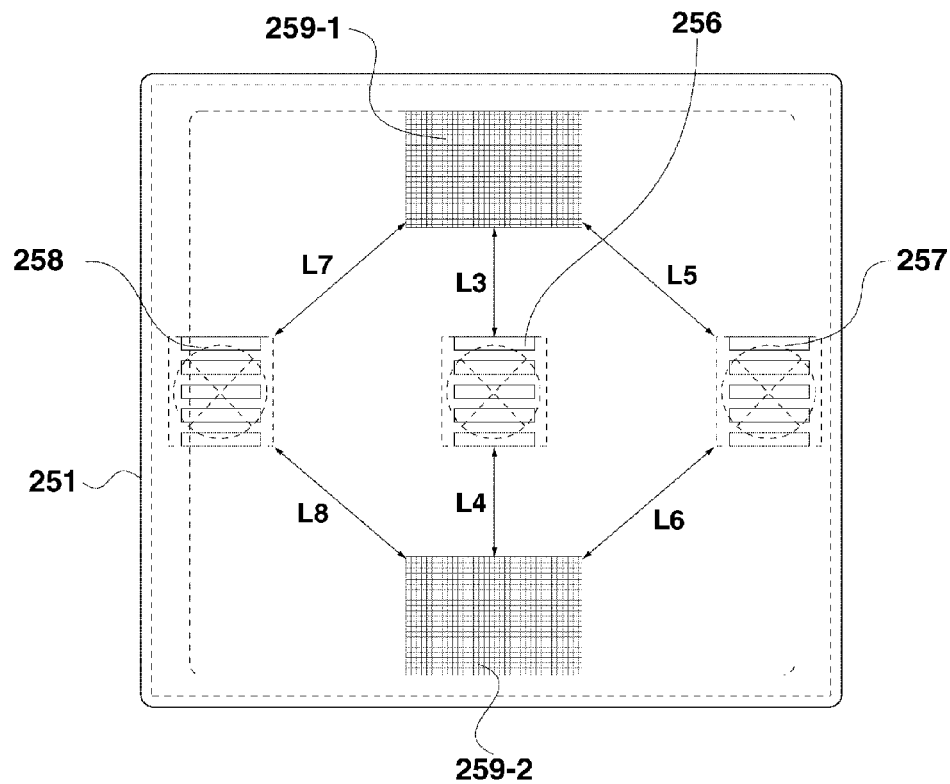
FIG. 12 is a rear view illustrating the radiation imaging apparatus.

FIGS. 9 to 12 schematically illustrate a radiation imaging apparatus according to a second exemplary embodiment of the present invention. FIG. 9 is a sectional view of the radiation imaging apparatus taken along a plane perpendicular to a radiation-image receiving surface. FIG. 10 is a sectional view taken along line E-E illustrated in FIG. 9. FIG. 11 is a sectional view taken along line F-F illustrated in FIG. 9. FIG. 12 is a rear view of the radiation imaging apparatus.

The radiation imaging apparatus according to the second exemplary embodiment includes a cassette-type imaging unit 150 and an imaging-unit housing portion 250.

Unlike the first exemplary embodiment, the cassette-type imaging unit 150 includes, in two directions, paths for reading a signal from a radiation detection unit. This arrangement is referred to as a two-sided reading method to be differentiated from a one-sided reading method described in the first exemplary embodiment. The two-sided reading method enables simultaneous reading of halves of a signal output from the radiation detection unit, shortening a period of time for reading. Thus, the two-sided reading method is suited to the radiation imaging apparatus where faster processing is required.

To realize the two-sided reading method, flexible printed circuit boards 164 that interconnect the radiation detection unit 101 and an electric substrate 160 are provided in opposing positions by a number twice as large as that in the case of the first exemplary embodiment.

The flexible printed circuit boards 164 are connected to two opposing sides of the radiation detection unit 101 having a rectangular outer shape. A signal amplifying unit for reducing noise is disposed in a position near the radiation detection unit. An electric element 165 is disposed near an outer edge of the radiation detection unit 101.

In the first exemplary embodiment, as the nearest exterior portion from the electric element 115, the heat conductive member 116 is disposed between the electric element 115 and the side surface to guide the heat to the side surface. In many cases, a bumper member is disposed on a side surface to absorb shocks during collision. The second exemplary embodiment describes a configuration example where heat is conducted to an area near a side surface of a rear surface of a cassette-type casing 152. FIG. 9 illustrates a bumper member 170 for absorbing shocks.

There is an embodiment where the arrangement of the electric elements of the electric substrate 160 is changed. However, arranging freedom of the electric substrate 160 is limited itself as described above, and hence an electric element 161 large in amount of generated heat concentrates near a center of the rear surface of the cassette-type imaging unit 150.

The electric elements 165 are disposed on both sides as in the case of the flexible printed circuit board 164. As a result, a distribution of heat exchange portions in the cassette-type imaging unit 150 is different from that in the first exemplary embodiment.

Figure 13:
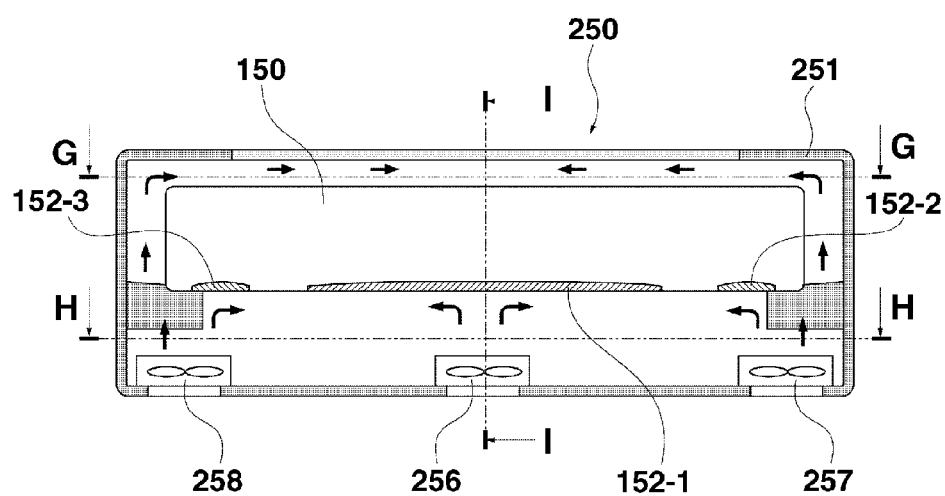
FIG. 13 illustrates a flow of a cooling medium according to the second exemplary embodiment.

FIG. 13 illustrates a flow of a cooling medium according to the second exemplary embodiment.

The cassette casing 152 includes a first heat exchange portion 152-1, a second heat exchange portion 152-2, and a third heat exchange portion 152-3. As in the case of FIG. 5, the electric substrate 160 includes an AD conversion unit, a signal processing unit, and a power source unit. There are many processing contents, and a high speed is required, increasing an amount of generated heat. An amount of heat concentrated in the first heat exchange portion 152-1 is larger than the other portions. An amount of heat concentrated in the second heat exchange portion 152-2 is almost equal to that in the third heat exchange portion 152-3.

Thus, in the second exemplary embodiment, the arrangement of a cooling fan and a discharge port in the imaging-unit housing portion 250 is different from that of the first exemplary embodiment. FIGS. 12 and 13 illustrate positions of cooling fans and discharge ports.

A first cooling fan 256 is disposed in a position for blowing a cooling medium toward the first heat exchange portion 152-1. An increase in amount of heat in the first heat exchange portion 152-1 can be dealt with by selecting a stronger fan or arraying a plurality of fans.

A second cooling fan 257 is disposed in a position for blowing the cooling medium toward the second heat exchange portion 152-2. A third cooling fan 258 is disposed in a position for blowing the cooling medium toward the third heat exchange portion 152-3.

The imaging-unit housing portion 250 includes a first discharge port 259-1 and a second discharge port 259-2. For a shortest flow path length between each cooling fan and each discharge port, among lengths L3 to L8 illustrated in FIG. 12, the lengths L5 to L8 are all set longer than the lengths L3 and L4.

Distances between the first cooling fan 256 and the discharge ports 259-1 and 259-2 are short. Thus, the cooling medium blown to the first heat exchange portion 152-1 by the first cooling fan 256, which has absorbed much heat, can be quickly discharged out of the imaging-unit housing portion 250.

The discharge ports 259-1 and 259-2 are disposed in positions neither between the first cooling fan 256 and the second cooling fan 257 nor between the first cooling fan 256 and the third cooling fan 258. As a result, flows of a cooling medium from the second and third cooling fans are affected by pressure addition by the first cooling fan, and a flow of a cooling medium from the first cooling fan is affected by pressure additions by the second and third cooling fans.

A flow of a cooling medium generated in the radiation imaging apparatus according to the second exemplary embodiment will be described.

Figure 14:
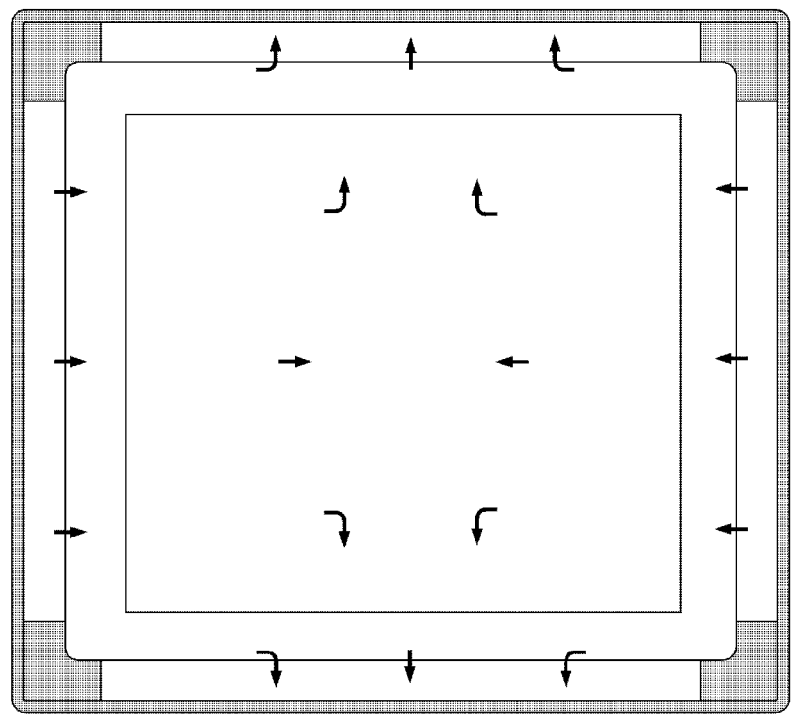
FIG. 14 is a sectional view taken along line G-G illustrated in FIG. 13.
Figure 15:
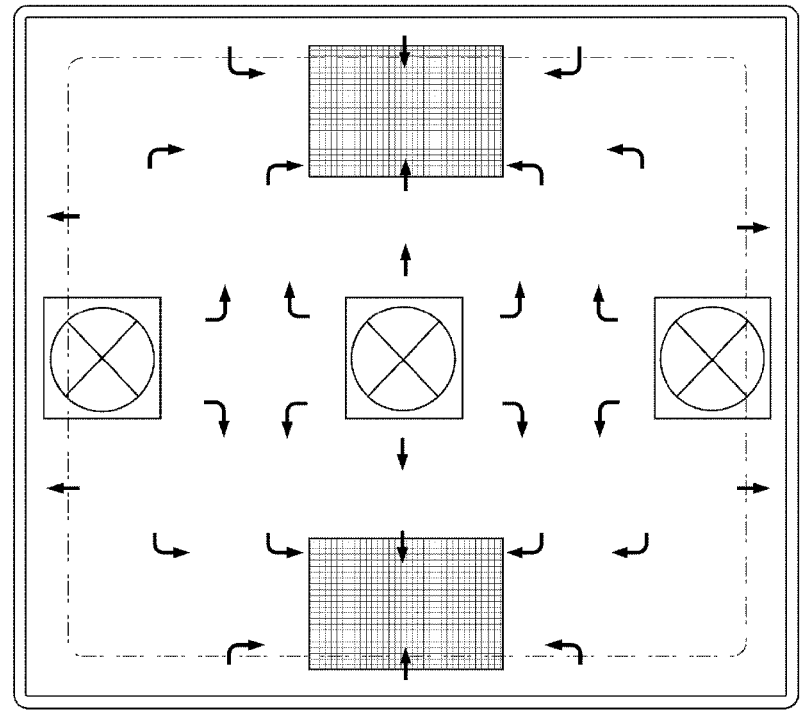
FIG. 15 is a sectional view taken along line H-H illustrated in FIG. 13.
Figure 16:
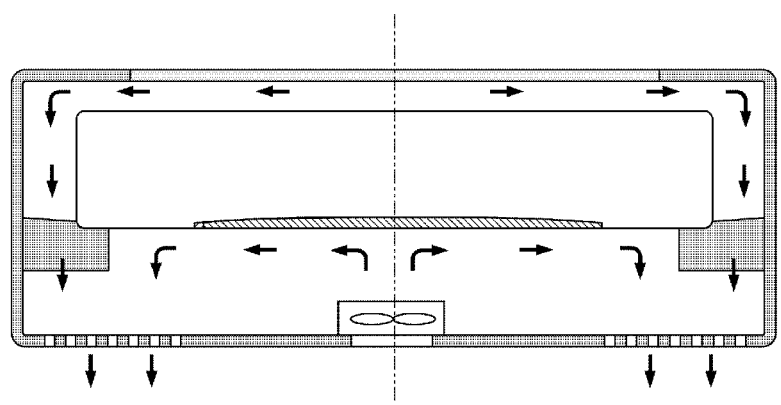
FIG. 16 is a sectional view taken along line I-I illustrated in FIG. 13.

FIGS. 13 to 16 schematically illustrate flows of a cooling medium in the radiation imaging apparatus according to the second exemplary embodiment. FIG. 13 is a vertical sectional view of the radiation imaging apparatus according to the second exemplary embodiment. FIG. 14 is a sectional view taken along line G-G illustrated in FIG. 13. FIG. 15 is a sectional view taken along line H-H illustrated in FIG. 13. FIG. 16 is a sectional view taken along line I-I illustrated in FIG. 13.

Flows of a cooling medium indicated by thick arrows are generated. A flow of the cooling medium from the first cooling fan 256 is directed to the first heat exchange portion 152-1, and most is directed not near the second and third cooling fans 257 and 258 where pressure is high but to the discharge port where pressure is low to be discharged to the outside. Flows of the cooling medium from the second and third cooling fans 257 and 258 are not directed near the first cooling fan 256 where pressure is high. Another part is blown to the second heat exchange portion 152-2 and the third heat exchange portion 152-3, and a part thereof flows toward the discharge port. The cooling medium is guided to a radiation-image receiving surface of the cassette-type imaging unit 150, absorbs heat of each portion of the cassette casing 152, and is discharged out of the discharger port.

As described above, the shortest flow path lengths between the first cooling fan 256 and the discharge ports 259-1 and 259-2 are both shorter than those between the second cooling fan 257 and the discharge ports 259-1 and 259-2 and between the third cooling fan 258 and the discharge ports 259-1 and 259-2. As a result, without losing cooling effects provided by the second and third cooling fans 257 and 258, the heat conducted from the first heat exchange portion 152-1 to the cooling medium can be quickly discharged to the outside while suppressing adverse effects of conduction of the heat back to the other portions. These effects are not limited to the radiation imaging apparatus that includes the first to third cooling fans. Similar effects can be provided by a radiation imaging apparatus that includes an unspecified number of cooling fans where fourth and more cooling fans are added.

The discharge ports 259-1 and 259-2 are both disposed in positions other than between the first cooling fan 256 and the second cooling fan 257 and between the first cooling fan 256 and the third cooling fan 258. With this arrangement, the flows of the cooling medium from the second and third cooling fans 257 and 258 are affected by pressure addition by the first cooling fan 256. Thus, a flow of a cooling medium directed to other than the second and third heat exchange portions 152-2 and 152-3 can be generated. The flow of the cooling medium from the first cooling fan 256 is affected by pressure additions by the second and third cooling fans 257 and 258, providing an effect of strengthening the flow of the cooling medium passed through the first heat exchange portion 152-1 to become high in temperature to the discharge ports 259-1 and 259-2. These effects are not limited to the radiation imaging apparatus that includes the three cooling fans, i.e., the first to third cooling fans. Similar effects can be provided by a radiation imaging apparatus that includes an unspecified number of cooling fans where fourth and more cooling fans are added.

In the second exemplary embodiment, the first heat exchange portion 152-1 is disposed so that the heat from the electric substrate 160 including the signal processing unit and the power source unit very large in amount of generated heat can be conducted. The second and third heat exchange portions 152-2 and 152-3 are disposed so that the heat from the flexible printed circuit board 164 including the signal amplifying unit equally large in amount of generated heat can be conducted. Thus, the cassette-type imaging unit can be effectively cooled.

When the radiation detection unit 101 has a rectangular outer shape, the flexible printed circuit boards 164 are connected to the two opposing sides of the radiation detection unit 101 and disposed near the outer edge. The electric substrate 160 is disposed near the center of the rear surface with respect to the radiation-image receiving surface of the radiation detection unit 101, and hence more appropriate cooling can be performed.

Irrespective of roles of the electric elements and limitation of the circuit substrate configuration, similar effects can be obtained by connecting various electric elements to the first, second, and third heat exchange portions.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-200244 filed Aug. 31, 2009, which is hereby incorporated by reference herein in its entirety.

The invention claimed is:

1. A radiation imaging apparatus comprising:
   a radiation detection unit housed within the radiation imaging apparatus and configured to detect radiation;
   a first cooling fan configured to cool a first heat generation portion of the radiation detection unit by blowing a cooling medium to the first heat generation portion;
   a second cooling fan configured to cool a second heat generation portion of the radiation detection unit by blowing the cooling medium to the second heat generation portion, an amount of heat generated by the second heat generation portion being larger than an amount of heat generated by the first heat generation portion; and
   a discharge port formed in a position nearer to the second heat generation portion than to the first heat generation portion and configured to discharge the cooling medium which received heat from the first heat generation portion and the cooling medium which received heat from the second heat generation portion,
   wherein the first cooling fan and the second cooling fan are disposed on a rear surface of the radiation imaging apparatus, the rear surface being opposite to a front surface on a radiation-receiving side of the radiation imaging apparatus, and
   wherein the discharge port is formed either on a side surface which joins the front surface to the rear surface or on the rear surface of the radiation imaging apparatus.

2. The radiation imaging apparatus according to claim 1, wherein the radiation detection unit includes a signal amplifying unit configured to amplify a detection signal of the radiation, and an electric substrate including a power source unit configured to supply power for driving the radiation detection unit and a signal processing unit configured to process a signal from the signal amplifying unit,
   wherein the first cooling fan cools the signal amplifying unit, and
   wherein the second cooling fan cools the electric substrate.

3. The radiation imaging apparatus according to claim 2, wherein the radiation detection unit is formed into a rectangular shape,
   wherein the signal amplifying unit is connected to at least one side of the radiation detection unit, and
   wherein the electric substrate is disposed on a rear surface of a radiation-image receiving surface of the radiation detection unit.

4. The radiation imaging apparatus according to claim 2, wherein the radiation detection unit is formed into a rectangular shape,
   wherein the signal amplifying unit includes a plurality of signal amplifying units respectively connected to two opposing sides of the radiation detection unit, and
   wherein the electric substrate is disposed on a rear surface of the radiation detection unit opposite to a radiation-image receiving surface of the radiation detection unit.

5. The radiation imaging apparatus according to claim 4, wherein the first cooling fan includes a plurality of cooling fans configured to cool the plurality of signal amplifying units, respectively, and
   wherein a plurality of discharge ports for discharging the cooling medium is formed in a position nearer to the electric substrate than to each of the plurality of signal amplifying units.

6. The radiation imaging apparatus according to claim 1, wherein the discharge port is formed on the rear surface of the radiation imaging apparatus at a position other than between the first cooling fan and the second cooling fan.

7. The radiation imaging apparatus according to claim 1, wherein the first cooling fan cools the entire radiation detection unit including the first heat generation portion of the radiation detection unit by blowing the cooling medium, and
   wherein the second cooling fan cools only the second heat generation portion by blowing the cooling medium.

8. A radiation imaging apparatus capable of housing a radiation detection unit configured to detect radiation, the radiation imaging apparatus comprising:
   a first cooling fan configured to cool a first heat generation portion by blowing a cooling medium to the first heat generation portion, the first heat generation portion including a flexible printed circuit board disposed on the radiation detection unit housed in the radiation imaging apparatus;
   a second cooling fan configured to cool a second heat generation portion by blowing the cooling medium to the second heat generation portion, the second heat generation portion disposed on a rear surface on an opposite side of an image receiving side of the radiation detection unit housed in the radiation imaging unit, and an amount of heat generated by the second heat generating portion being larger than an amount of heat generated by the first heat generation portion; and
   a discharge port formed in a position nearer to the second heat generation portion than to the first heat generation portion and configured to discharge the cooling medium which received heat from the first heat generation portion and the cooling medium which received heat from the second heat generation portion,
   wherein the first cooling fan and the second cooling fan are disposed on a rear surface of the radiation imaging apparatus, the rear surface being opposite to a front surface on a radiation-receiving side of the radiation imaging apparatus, and
   wherein the discharge port is formed either on a side surface which joins the front surface to the rear surface or on the rear surface of the radiation imaging apparatus.

\* \* \* \* \*